United States Patent
Ji et al.

(10) Patent No.: US 9,627,279 B2
(45) Date of Patent: Apr. 18, 2017

(54) METHOD FOR REMOVING DEFECTIVE LIGHT EMITTING DIODE (LED) PACKAGE FROM LED PACKAGE ARRARY

(71) Applicant: SAMSUNG ELECTRONICS CO., LTD., Suwon-si (KR)

(72) Inventors: Won Soo Ji, Suwon (KR); Choo Ho Kim, Yongin (KR); Sung Hoon Oh, Yongin (KR); Min Hwan Kim, Suwon (KR); Beom Seok Shin, Suwon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 7 days.

(21) Appl. No.: 14/502,463

(22) Filed: Sep. 30, 2014

(65) Prior Publication Data

US 2015/0017748 A1    Jan. 15, 2015

Related U.S. Application Data

(62) Division of application No. 13/278,887, filed on Oct. 21, 2011, now abandoned.

(30) Foreign Application Priority Data

Nov. 16, 2010   (KR) .......................... 10-2010-0114128

(51) Int. Cl.
*G01R 31/28* (2006.01)
*H01L 21/66* (2006.01)
(Continued)

(52) U.S. Cl.
CPC .......... *H01L 22/14* (2013.01); *G01R 31/2601* (2013.01); *H01L 33/48* (2013.01);
(Continued)

(58) Field of Classification Search
CPC ...... G01R 31/2601; H01L 2924/01079; Y10T 29/49117; Y10T 29/49121
See application file for complete search history.

(56) References Cited

U.S. PATENT DOCUMENTS 3,688,255 A  *  8/1972  Klein et al. ................... 340/452
3,840,852 A  *  10/1974  Schwellenbach ............. 340/458
(Continued)

FOREIGN PATENT DOCUMENTS

JP       06-174784        * 12/1992
JP       6-174784 A       6/1994
(Continued)

OTHER PUBLICATIONS

Communication dated Aug. 23, 2012, issued by the Korean Intellectual Property Office in counterpart Korean Application No. 10-2010-0114128.
(Continued)

*Primary Examiner* — Paul D Kim
(74) *Attorney, Agent, or Firm* — Sughrue Mion, PLLC

(57) ABSTRACT

An apparatus for manufacturing an light emitting diode (LED) package, includes: a heating unit heating an LED package array in a lead frame state in which a plurality of LED packages are installed to be set in an array on a lead frame; a testing unit testing an operational state of each of the LED packages in the LED package array by applying a voltage or a current to the LED package array heated by the heating unit; and a cutting unit cutting only an LED package determined to be a functional product or an LED package determined to be a defective product from the lead frame to remove the same according to the testing results of the testing unit.

10 Claims, 3 Drawing Sheets

(51) Int. Cl.
  *G01R 31/26* (2014.01)
  *H01L 33/48* (2010.01)

(52) U.S. Cl.
  CPC .... *G01R 31/2635* (2013.01); *H01L 2933/005* (2013.01); *H01L 2933/0033* (2013.01); *Y10T 29/51* (2015.01)

(56) References Cited

U.S. PATENT DOCUMENTS

| | | | | |
|---|---|---|---|---|
| 4,379,259 A * | 4/1983 | Varadi et al. | | 714/45 |
| 4,447,806 A * | 5/1984 | Gundel et al. | | 340/641 |
| 4,984,999 A * | 1/1991 | Leake | | F21V 21/002 |
| | | | | 439/419 |
| 5,047,721 A * | 9/1991 | Farley | | H01K 3/305 |
| | | | | 324/133 |
| 5,157,829 A * | 10/1992 | Schmidt et al. | | 29/846 |
| 5,319,312 A * | 6/1994 | Segilia | | G01R 31/44 |
| | | | | 324/133 |
| 5,389,953 A * | 2/1995 | Agar et al. | | 347/5 |
| 5,880,590 A * | 3/1999 | Desai et al. | | 324/750.05 |
| 5,959,462 A * | 9/1999 | Lum | | 324/750.05 |
| 6,119,255 A * | 9/2000 | Akram | | 714/724 |
| 6,189,120 B1 | 2/2001 | Akram | | |
| 6,229,326 B1 * | 5/2001 | Yu | | 324/750.05 |
| 6,349,396 B2 * | 2/2002 | Akram | | 714/724 |
| 6,372,608 B1 * | 4/2002 | Shimoda et al. | | 438/455 |
| 6,645,830 B2 | 11/2003 | Shimoda et al. | | |
| RE38,466 E | 3/2004 | Inoue et al. | | |
| 6,771,086 B2 * | 8/2004 | Lutz et al. | | 324/750.09 |
| 6,818,465 B2 * | 11/2004 | Biwa et al. | | 438/22 |
| 6,818,530 B2 | 11/2004 | Shimoda et al. | | |
| 6,858,081 B2 * | 2/2005 | Biwa et al. | | 117/89 |
| 6,967,353 B2 * | 11/2005 | Suzuki et al. | | 257/95 |
| 7,002,182 B2 * | 2/2006 | Okuyama et al. | | 257/91 |
| 7,084,420 B2 * | 8/2006 | Kim et al. | | 257/13 |
| 7,087,932 B2 * | 8/2006 | Okuyama et al. | | 257/89 |
| 7,154,124 B2 * | 12/2006 | Han et al. | | 257/88 |
| 7,208,725 B2 * | 4/2007 | Sherrer et al. | | 250/239 |
| 7,250,872 B2 | 7/2007 | Klinger | | |
| 7,288,758 B2 | 10/2007 | Sherrer et al. | | |
| 7,319,044 B2 | 1/2008 | Han et al. | | |
| 7,432,717 B2 * | 10/2008 | Frederick | | F21S 9/04 |
| | | | | 324/414 |
| 7,501,656 B2 * | 3/2009 | Han et al. | | 257/79 |
| 7,652,480 B2 * | 1/2010 | Mollet | | 324/522 |
| 7,709,857 B2 * | 5/2010 | Kim et al. | | 257/100 |
| 7,759,140 B2 * | 7/2010 | Lee et al. | | 438/22 |
| 7,781,727 B2 | 8/2010 | Sherrer et al. | | |
| 7,790,482 B2 | 9/2010 | Han et al. | | |
| 7,838,790 B2 * | 11/2010 | Kang et al. | | 209/573 |
| 7,893,455 B2 * | 2/2011 | Ogihara et al. | | 257/104 |
| 7,940,350 B2 * | 5/2011 | Jeong | | 349/62 |
| 7,959,312 B2 * | 6/2011 | Yoo et al. | | 362/84 |
| 7,964,881 B2 * | 6/2011 | Choi et al. | | 257/89 |
| 7,985,976 B2 | 7/2011 | Choi et al. | | |
| 7,994,525 B2 * | 8/2011 | Lee et al. | | 257/94 |
| 8,008,683 B2 * | 8/2011 | Choi et al. | | 257/99 |
| 8,013,352 B2 * | 9/2011 | Lee et al. | | 257/98 |
| 8,049,161 B2 | 11/2011 | Sherrer et al. | | |
| 8,129,711 B2 * | 3/2012 | Kang et al. | | 257/17 |
| 8,179,938 B2 * | 5/2012 | Kim | | 372/43.01 |
| 8,263,987 B2 | 9/2012 | Choi et al. | | |
| 8,324,646 B2 | 12/2012 | Lee et al. | | |
| 8,399,944 B2 * | 3/2013 | Kwak et al. | | 257/432 |
| 8,432,511 B2 | 4/2013 | Jeong | | |
| 8,459,832 B2 * | 6/2013 | Kim | | 362/231 |
| 8,502,242 B2 * | 8/2013 | Kim | | 257/88 |
| 8,536,604 B2 | 9/2013 | Kwak et al. | | |
| 8,735,931 B2 * | 5/2014 | Han et al. | | 257/99 |
| 8,766,295 B2 | 7/2014 | Kim | | |
| 2001/0054955 A1 * | 12/2001 | Diez | | 340/435 |
| 2005/0242822 A1 * | 11/2005 | Klinger | | 324/523 |
| 2006/0097726 A1 * | 5/2006 | Frederick | | F21S 4/10 |
| | | | | 324/414 |
| 2012/0122250 A1 * | 5/2012 | Ji et al. | | 438/15 |

FOREIGN PATENT DOCUMENTS

| | | | |
|---|---|---|---|
| JP | 2005-64290 A | | 3/2005 |
| JP | 2007-80881 A | | 3/2007 |
| JP | 2010-40744 A | | 2/2010 |
| KR | 10-2009-0097349 A | | 9/2009 |
| KR | 1020110096944 | * | 2/2010 |
| KR | 10-2010-0098884 A | | 9/2010 |
| KR | 10-2010-0099945 A | | 9/2010 |
| KR | 10-0989561 B1 | | 10/2010 |
| KR | 10-2011-0096944 A | | 8/2011 |

OTHER PUBLICATIONS

Restriction Requirement in U.S. Appl. No. 13/278,887 mailed Aug. 23, 2013.
Non Final Office Action in U.S. Appl. No. 13/278,887 mailed Oct. 2, 2013.
Final Office Action in U.S. Appl. No. 13/278,887 mailed Apr. 30, 2014.
Advisory Action in U.S. Appl. No. 13/278,887 mailed Aug. 6, 2014.

* cited by examiner

METHOD FOR REMOVING DEFECTIVE LIGHT EMITTING DIODE (LED) PACKAGE FROM LED PACKAGE ARRARY

CROSS-REFERENCE TO RELATED APPLICATIONS

This is a divisional application of U.S. patent application Ser. No. 13/278,887, filed Oct. 21, 2011, now abandoned which claims the priority of Korean Patent Application No. 10-2010-0114128 filed on Nov. 16, 2010, in the Korean Intellectual Property Office, the disclosure of which is incorporated herein by reference in its entirety.

BACKGROUND

Field

The present invention relates to an apparatus and a method for manufacturing a light emitting diode (LED) package and, more particularly, to an apparatus and a method for manufacturing an LED package capable of discriminating (or distinguishing) between a functional product and a defective product by inspecting an operational state of an LED package.

Description of the Related Art

Recently, an LED has come to prominence as a light source of various purposes such as a light source of a backlight unit or for general lighting (or illumination). An LED is used in the form of a package by mounting a semiconductor-based LED chip on a substrate and applying a light-transmissive resin thereto. The light-transmissive resin used for the LED package may include a phosphor according to the desired color of output light to be implemented.

In a general LED package fabrication process, a die bonding process is performed in which an LED chip is mounted on a mounting area of a package main body or a package substrate and fixed thereto, and then, a wire bonding process for connecting electrodes is performed to mount the LED chip on the package main body or the package substrate. In this case, a plurality of LED chips may be set in an array on a plurality of mounting areas of the package main body. Thereafter, a light-transmissive resin (e.g., a silicon resin including phosphors, or the like) is dispensed to the LED package and then cured (or hardened). After the light-transmissive resin is hardened, a singulation process or a lead frame trimming or forming process is performed. Thereafter, the LED package is completely separated as an individual package is tested or inspected.

In the foregoing processes, when the bonding is not properly performed in the wire bonding operation, the contact between an electrode pad and a wire of the LED chip or the contact between a stitch and the wire of the substrate (sub-mount, or the like) may be defective. With such a defective contact, the LED package may be normally operated at room temperature, but an open or short phenomenon may occur in the connection means, such as wire bonding or the like at a high temperature, causing the product to be defective. In particular, when the LED package enters a high temperature state due to heat generated by the continuous use of the LED package, the problem caused by the defective contact greatly affects the reliability of the product.

In order to check the open or short state of the LED package, or whether or not the LED package is lighted (or turned on), a process of testing the manufactured LED package is performed. The LED package testing process is performed on each of the LED packages which have been separated as individual packages through the trimming and forming process as described above. Thus, a great deal of time is required to test the mass-produced LED packages, lowering the testing efficiency.

SUMMARY

An aspect of the present invention provides an apparatus for manufacturing a light emitting diode (LED) package capable of effectively testing an operational state of LED packages and enhancing the reliability of a final LED package product.

Another aspect of the present invention provides a method for manufacturing a light emitting diode (LED) package capable of effectively testing an operational state of LED packages and enhancing the reliability of a final LED package product. According to an aspect of the present invention, there is provided an apparatus for manufacturing an LED package, including: a heating unit heating an LED package array in a lead frame state in which a plurality of LED packages are installed to be set in an array on a lead frame; a testing unit testing an operational state of each of the LED packages in the LED package array by applying a voltage or a current to the LED package array heated by the heating unit; and a cutting unit cutting only an LED package determined to be a functional product or an LED package determined to be a defective product according to the testing results of the testing unit so as to be removed from the lead frame.

The heating unit may include: a low temperature heating unit heating the LED package array in a first temperature range; and a high temperature heating unit heating the LED package array, which has been heated by the low temperature heating unit, in a second temperature range higher than the first temperature range.

The heating unit may heat the LED package array as a testing target to 80° C. to 300° C.

The heating unit may heat the LED package array as a testing target to 180° C. to 250° C.

The testing unit may include a multi-probe pin array for simultaneously applying a driving voltage or current to the plurality of LED packages in the LED package array.

The testing unit may test the operational state of the LED package by simultaneously applying a driving voltage or current to the plurality of LED packages in the LED package array.

The testing unit may test whether or not each of the LED packages is open or short or lighted (or turned on) by applying a driving voltage or current to the plurality of LED packages in the LED package array.

The testing unit may further include a camera for checking whether or not each of the LED packages in the LED package array is lighted.

The LED package manufacturing apparatus may further include: a loading unit supplying a testing target LED package array from the exterior to the heating unit; and an unloading unit unloading the LED package array from the cutting unit.

According to an aspect of the present invention, there is also provided a method for manufacturing an LED package, including: preparing an LED package array in a lead frame state in which a plurality of LED packages are installed to be set in an array on a lead frame; heating the LED package array; testing an operational state of each of the LED packages in the LED package array by applying a voltage or a current to the LED package array heated by the heating unit; and cutting only an LED package determined to be a functional product or an LED package determined to be a defective product from the lead frame to remove the same according to the operational state testing results.

The method may further include: inspecting an external appearance of the LED package array before heating the LED package array.

The heating of the LED package array may include: a low temperature heating step of heating the LED package array in a first temperature range; and a high temperature heating step of heating the LED package array, which has been heated in the low temperature heating step, in a second temperature range higher than the first temperature range.

In the heating of the LED package array, the LED package array as a testing target may be heated to 80° C. to 300° C.

In the heating of the LED package array, the LED package array as a testing target may be heated to 180° C. to 250° C.

In the testing of the operational state of the LED packages, the operational state of the LED packages in the LED package array may be tested by simultaneously applying a driving voltage or current to the plurality of LED packages through a multi-probe pin array.

In the testing of the operational state of the LED packages, the operational state of the LED packages in the LED package array may be tested by simultaneously applying a driving voltage or current to the plurality of LED packages.

In the testing of the operational state of the LED packages, whether or not the respective LED packages are open or short or lighted may be tested by simultaneously applying a driving voltage or current to the plurality of LED packages.

In the testing of the operational state of the LED packages, whether or not the respective LED packages in the LED package array are lighted may be tested by using a camera.

The method may further include: a loading step of supplying the testing target LED package array to a heating unit from the exterior; and an unloading step of unloading the LED package array which has undergone a cutting and removing step.

Each of the LED packages in the LED package array as a testing target may be a package which has completely undergone a transparent resin applying process and a transparent resin curing process.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION

Figure 1:
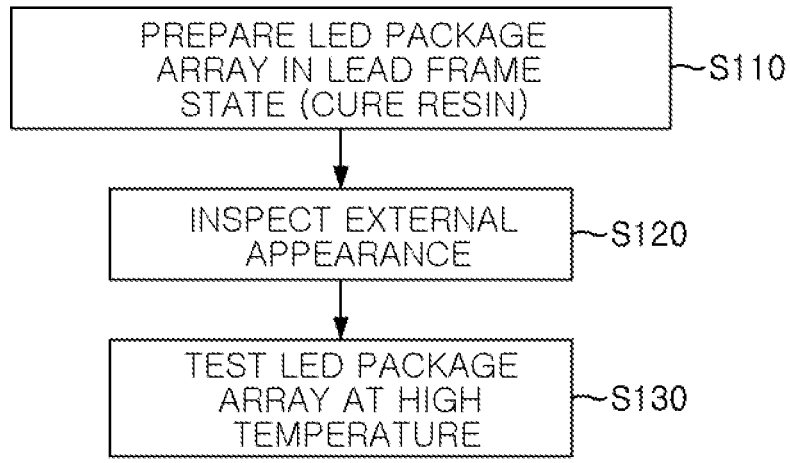
FIG. 1 is a schematic view showing a process of testing a light emitting diode (LED) package according to an exemplary embodiment of the present invention.

Exemplary embodiments of the present invention will now be described in detail with reference to the accompanying drawings. The invention may however be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a schematic view showing a process of testing a light emitting diode (LED) package according to an exemplary embodiment of the present invention. With reference to FIG. 1, first, an LED package array in a lead frame (L/F) state is prepared as a testing target (step S110). The LED package array includes a plurality of LED packages installed in a lead frame so as to be set in an array, which corresponds to a state prior to a trimming or singulation process in which the plurality of LED packages are cut or separated into individual LED packages. In particular, each of the LED packages in the LED package array may be in a package for which a dispensing processing of applying a transparent resin (e.g., a silicon resin including phosphors, or the like) to the LED packages and a curing process of curing the applied transparent resin have been completed.

Next, an external appearance of the LED package array is inspected (step S120). In the inspection of the external appearance of the LED package array, whether or not a particular LED package of the LED package array has a defective connection can be observed with the naked eye, and so on. This inspection process may be omitted.

Then, a high temperature testing process is performed on the LED package array in the lead frame state (namely, on the LED package array on the lead frame) (step S130). In the high temperature testing process (step S130), the LED package array is heated and an operational state of each of the LED packages in the LED package array is tested. Specifically, whether or not each of the LED packages of the LED package array is electrically short or open or lighted (or turned on) is tested to be checked. In this case, in order to test the operational state of each of the LED packages on the lead frame, a driving voltage or current is applied to the electrodes of the respective LED packages.

Figure 2:
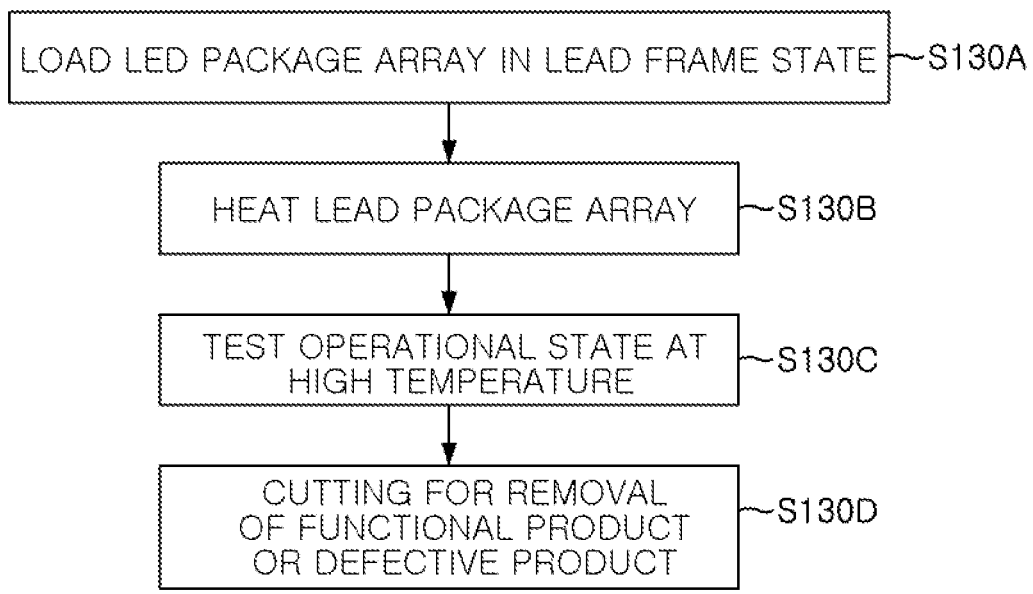
FIG. 2 is a detailed view of a high temperature testing process (step S130) of FIG. 1.

FIG. 2 is a detailed view of the high temperature testing process (step S130) of FIG. 1. First, the LED package array on the lead frame is loaded onto a testing system so as to be supplied to a heating unit 120 (See FIG. 3) (step S130A). The loaded testing target LED package array is heated to a temperature higher than room temperature (step S130B). In this case, the LED package array as a testing target may be heated to a temperature ranging from 80° C. to 300° C. In particular, considering that a defective connection occurs at a high temperature, the LED package array as a testing target may be heated to a temperature ranging from 180° C. to 250° C. With the LED package array heated within the temperature range, an operational state of each of the LED packages of the LED package array is tested to thus sufficiently find and weed out a latent defective LED package expected to have a defective connection at a high temperature. The temperature range may vary depending on the intended purpose of use of the LED package or a desired level of reliability thereof.

In an exemplary embodiment, the LED package array may be heated in two or more stages. Namely, the LED package array may undergo a low temperature heating process in which the LED package array is heated to within a first temperature range, and then, the LED package array may be heated to within a second temperature range higher than the first temperature range. In this manner, because the LED package array is heated in two or more stages, heating efficiency can be increased while restraining a thermal impact possibly applied to the LED package.

An operational state of the LED package is tested by applying a driving voltage or a current to each of the LED packages in the LED package array in the high temperature state by using a prober, or the like (step S130C). Since the operational state of each of the LED packages is tested in the heated state, a latent defective LED package product, which can be hardly discovered at room temperature, can be checked and sorted out, so the reliability of the testing operation can be improved. Besides, since the LED package array on the lead frame is tested overall, testing efficiency can be improved as compared with the related art testing performed on individual separated LED package products.

A driving voltage or current can be simultaneously applied to two or more of the LED packages in the LED package array by using a multi-probe pin array. With the driving voltage or current simultaneously applied to the plurality of LED packages, the operational state of the plurality of LED packages can be simultaneously tested. In particular, in an exemplary embodiment, the operational state of the LED packages in the LED package array may be tested by the unit of the LED package array at a time by simultaneously applying the driving voltage or current to all of the LED packages in the LED package array on the lead frame as a testing target. This simultaneous testing by simultaneously applying a voltage or a current to the LED packages further increases the efficiency of the testing thereof.

In testing the operational state of each of the LED packages in the LED package array on the lead frame, whether or not each of the LED packages is open or short, lighted, or the like, can be tested. Whether or not each of the LED packages is open or short can be checked by using a voltage or current measurement machine connected to the prober, and whether or not each of the LED packages is lighted can be checked with a camera or the naked eye. In particular, the use of a camera 80 (See FIG. 4) to test whether or not each of the LED packages is lighted can enhance the speed and accuracy of the testing operation.

According to the operational state testing results, only an LED package determined to be a functional product or a defective product is cut to be removed from the corresponding LED package array (step S130D). In this manner since only the functional or defective LED package product is cut to be removed from the lead frame according to the results of testing performed on the LED package array on the lead frame, functional and defective LED package products can be classified in the initial stage, which further enhances the efficiency of a follow-up rank classification operation (a binning process, or the like) according to optical characteristics of the LED packages. After the process of cutting the functional or defective package product is performed, the LED package array is unloaded to be taken out of the testing system.

Figure 3:
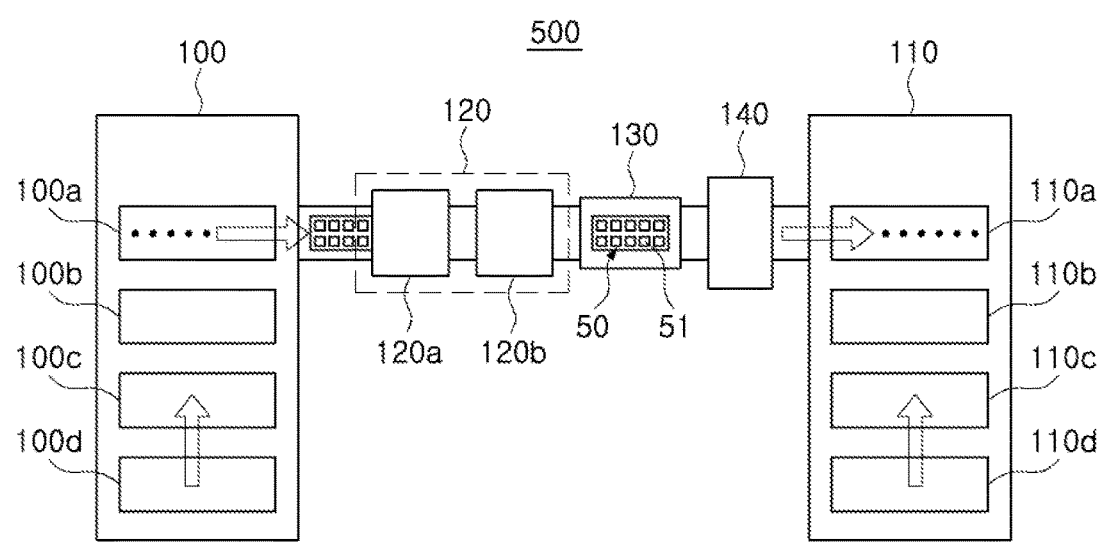
FIG. 3 is a schematic view of an apparatus for manufacturing an LED package according to an exemplary embodiment of the present invention.
Figure 4:
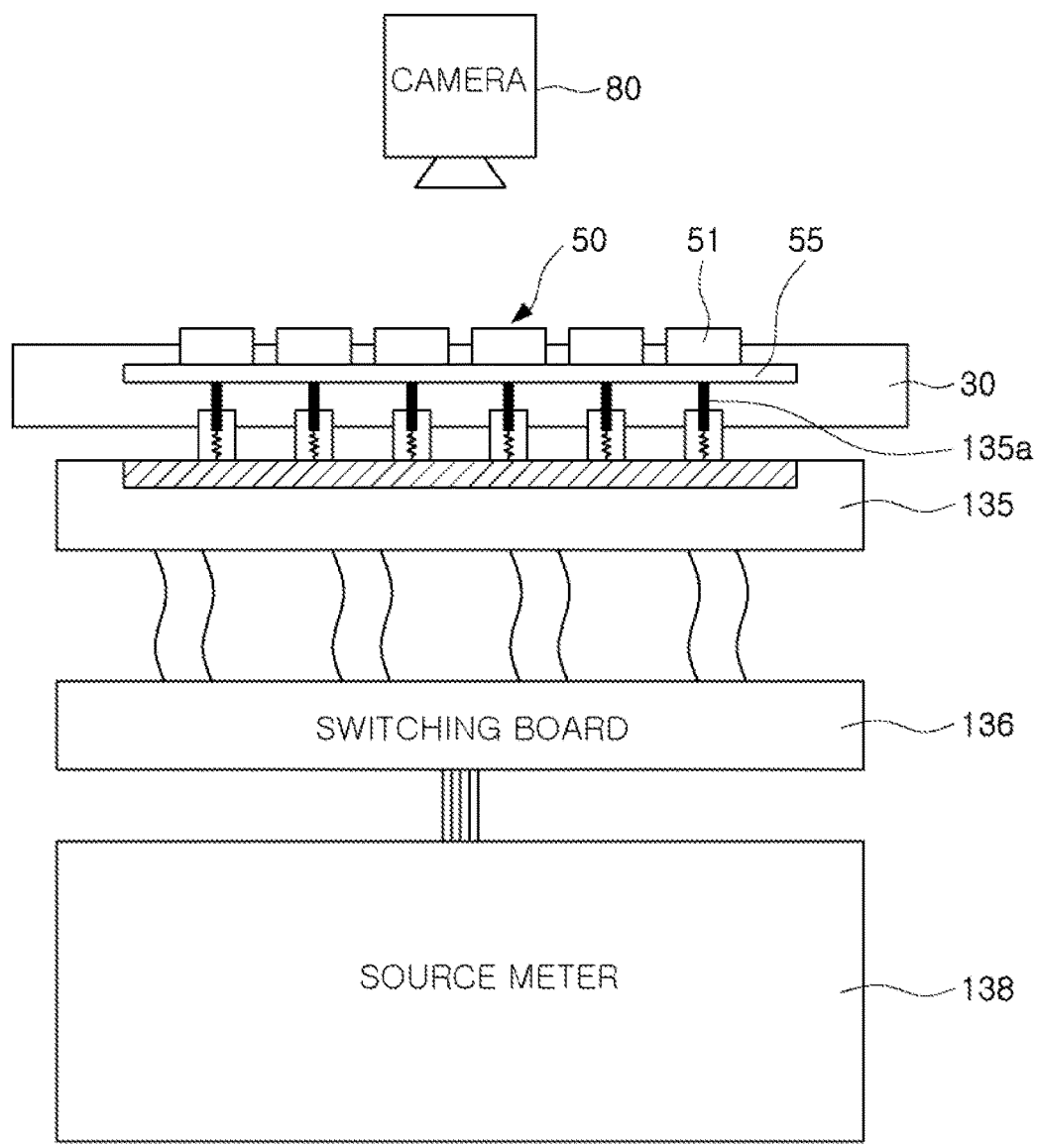
FIG. 4 is a schematic view of a testing unit provided in the apparatus for manufacturing an LED package according to an exemplary embodiment of the present invention.

FIG. 3 is a schematic view of an apparatus for manufacturing an LED package according to an exemplary embodiment of the present invention, and FIG. 4 is a schematic view of a testing unit provided in the apparatus for manufacturing an LED package. The foregoing manufacturing process can be executed by using the manufacturing apparatus of FIGS. 3 and 4.

With reference to FIG. 3, the manufacturing apparatus 500 includes a loading unit 100, a heating unit 120, a testing unit 130, a cutting unit 140, and an unloading unit 110. The loading unit 100 supplies a testing target LED package array to the heating unit 120 from the outside of the testing system. In the loading unit 100, accommodating (or receiving) units 100a, 100b, 100c, and 100d, e.g., a case such as a magazine, or the like, for accommodating or receiving the LED package array on a lead frame therein may be mounted. The LED package array is supplied from the magazine to the heating unit 120.

The heating unit 120 heats the LED package array on the lead frame to a certain high temperature (e.g., a temperature of 80° C. to 300° C. or 180° C. to 250° C.). The heating unit 120 may include two heating parts, i.e., a low temperature heating unit 120a and a high temperature heating unit 120b, in order to perform two-stage heating. The low temperature heating unit 120a heats the LED package array within a first temperature range (e.g., 100° C. to 140° C.), and the high temperature heating unit 120b additionally heats the LED package array, which has been heated by the low temperature heating unit 120a, to reach a second temperature range (e.g., 240° C. to 260° C.).

The testing unit 130 tests the operational state of each of the LED packages in the LED package array. Namely, the testing unit 130 tests whether or not each of the LED packages 51 in the LED package array 50 is short/open, lighted, or the like, by applying a voltage or a current to the LED package array 50 which has been heated by the heating unit 120. In this case, the testing unit can apply a driving voltage or current to each of the LED packages 51 in the LED package array 50 by using a probe pin. The cutting unit 140 cuts only an LED package determined to be a functional product or a defective product according to the testing results of the testing unit so as to be removed from the lead frame 55 (See FIG. 4).

With reference to FIG. 4, the testing unit 130 may include a probe 135 having a multi-probe pin array 135a for simultaneously applying a driving voltage or current to the plurality of LED packages 51 in the LED package array 50 on the lead frame. The LED package array 50 may be fixedly disposed in the mounting part 30 to allow the LED packages 51 to be tested. A switching board 136 for controlling an ON/OFF operation of each probe pin of the prober 135 may be connected to the prober 135, and a source meter 138 or a power source may be connected to the switching board.

The operational state of the LED packages 51 can be tested by simultaneously applying the driving voltage or current to all the LED packages 51 in the LED package array 50 through the testing unit 130. Also, the testing unit 130 may include the camera 80 to check whether or not each of the LED packages 51 in the LED package array is lighted (or turned on).

The unloading unit 110 unloads the LED package array 50 from the cutting unit 140. The unloading unit 110 may include accommodating units 110a, 110b, 110c, and 110d, such as a magazine, for accommodating the LED package array 50.

As set forth above, according to exemplary embodiments of the invention, an LED package array, in which a plurality of LED packages are set in an array on a lead frame, is heated and an operational state of each of the LED packages (i.e., whether or not they are open/short, or lighted, etc.) is tested at a high temperature, thereby maximizing testing efficiency of the LED packages and enhancing the reliability of final LED package products. Also, after the testing of the operation state of each of the LED packages, only a functional package or a defective package is cut to be removed from the LED packages on the lead frame, thus effectively discriminating between a functional package product and a defective package product at the early stage of a manufacturing process and effectively performing a follow-up rank classification (a binning process, or the like) on the products through an optical characteristics measurement.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for removing a defective light emitting diode (LED) package from an LED package array, the method comprising:
preparing the LED package array by providing a plurality of LED packages on a lead frame;
testing an operational state of each of the LED packages in the LED package array by applying a voltage or a current to the LED package array, while the LED package array is heated during a heating operation;
generating test results indicating whether each of the LED packages in the LED package array is a functional LED package or the defective LED package, based on the testing; and
cutting one of the LED packages determined to be the defective LED package among the LED packages in the LED package array according to the test results so as to remove the one of the LED packages from the lead frame,
wherein the heating operation comprises:
a low temperature heating operation of heating the LED package array in a first temperature range; and
a high temperature heating operation of heating the LED package array, which has been heated in the low temperature heating operation, in a second temperature range higher than the first temperature range.

2. The method of claim 1, further comprising:
inspecting an external appearance of the LED package array before performing the heating operation to heat the LED package array.

3. The method of claim 1, wherein in the heating operation, the LED package array is heated to a temperature ranging from 80° C. to 300° C.

4. The method of claim 1, wherein in the heating operation, the LED package array is heated to a temperature ranging from 180° C. to 250° C.

5. The method of claim 1, wherein, in the testing of the operational state of the LED packages, the operational state of the LED packages in the LED package array is tested by simultaneously applying a driving voltage or current to the plurality of LED packages through a multi-probe pin array.

6. The method of claim 1, wherein, in the testing of the operational state of the LED packages, the operational state of the LED packages in the LED package array is tested by simultaneously applying a driving voltage or current to the plurality of LED packages.

7. The method of claim 1, wherein, in the testing of the operational state of the LED packages, whether or not the respective LED packages are open or short or lighted is tested by simultaneously applying a driving voltage or current to the plurality of LED packages.

8. The method of claim 1, wherein, in the testing of the operational state of the LED packages, whether or not the respective LED packages in the LED package array are lighted is tested by using a camera.

9. The method of claim 1, further comprising:
a loading operation of supplying the LED package array to a heating unit from the exterior; and
an unloading operation of unloading the LED package array which has undergone the cutting and removing step.

10. The method of claim 1, wherein each of the LED packages in the LED package array as a testing target is a package which has completely undergone a transparent resin applying process and a transparent resin curing process.

* * * * *